United States Patent
SeyedzadehDelcheh

(10) Patent No.: US 11,488,654 B2
(45) Date of Patent: Nov. 1, 2022

(54) MEMORY ROW RECORDING FOR MITIGATING CROSSTALK IN DYNAMIC RANDOM ACCESS MEMORY

(71) Applicant: Advanced Micro Devices, Inc., Santa Clara, CA (US)

(72) Inventor: SeyedMohammad SeyedzadehDelcheh, Bellevue, WA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 17 days.

(21) Appl. No.: 16/902,204

(22) Filed: Jun. 15, 2020

(65) Prior Publication Data

US 2021/0390998 A1 Dec. 16, 2021

(51) Int. Cl.
  G11C 7/22 (2006.01)
  G11C 11/4078 (2006.01)
  G06F 12/121 (2016.01)
  G11C 11/408 (2006.01)
  G06F 12/0862 (2016.01)
  G11C 11/406 (2006.01)

(52) U.S. Cl.
  CPC ...... *G11C 11/4078* (2013.01); *G06F 12/0862* (2013.01); *G06F 12/121* (2013.01); *G11C 11/4085* (2013.01); *G11C 11/40603* (2013.01); *G06F 2212/1032* (2013.01)

(58) Field of Classification Search
  CPC .......... G11C 11/4078; G11C 11/40603; G11C 11/4085; G06F 12/0862; G06F 12/121; G06F 2212/1032
  See application file for complete search history.

(56) References Cited

U.S. PATENT DOCUMENTS

| 9,812,185 | B2* | 11/2017 | Fisch | G11C 11/4087 |
| 10,642,618 | B1* | 5/2020 | Hakewill | G06F 9/3804 |
| 10,950,292 | B1* | 3/2021 | SeyedzadehDelcheh | G06F 12/1018 |
| 2019/0050332 | A1* | 2/2019 | Alameldeen | G06F 12/0891 |
| 2019/0096472 | A1* | 3/2019 | Kang | G11C 11/40611 |

(Continued)

OTHER PUBLICATIONS

Aweke, Zelalem Birhanu, et al. "ANVIL: Software-based protection against next-generation rowhammer attacks." ACM SIGPLAN Notices 51.4 (2016): 743-755.

(Continued)

*Primary Examiner* — Mushfique Siddique
(74) *Attorney, Agent, or Firm* — Liang & Cheng, PC

(57) ABSTRACT

A method includes adding a set of one or more victim rows to a first probabilistic filter and to a second probabilistic filter, in response to a memory access request, identifying a candidate victim row adjacent to a memory address specified by a memory access request, identifying the candidate victim row as a victim row in the set of victim rows based on performing a lookup of the candidate victim row in a selected filter, where the selected filter includes one of the first probabilistic filter and the second probabilistic filter, in response to identifying the candidate row as the victim row, enabling a row hammering countermeasure, clearing the first probabilistic filter in each of a first set of time periods, and clearing the second probabilistic filter in each of a second set of time periods interleaved with the first set of time periods.

20 Claims, 6 Drawing Sheets

(56) References Cited

U.S. PATENT DOCUMENTS

2020/0005857 A1* 1/2020 Ito ................ G11C 11/40615
2020/0167327 A1* 5/2020 Breslow ............... G06F 3/0689

OTHER PUBLICATIONS

Bloom, Burton H. "Space/time trade-offs in hash coding with allowable errors." Communications of the ACM 13.7 (1970): 422-426.

Fan, Bin, et al. "Cuckoo filter: Practically better than bloom." Proceedings of the 10th ACM International on Conference on emerging Networking Experiments and Technologies. 2014.

Herath, Nishad, and Anders Fogh. "These are not Your Grand Daddys CPU Performance Counters—CPU Hardware Performance Counters for Security." Black Hat Briefings (2015).

Jeong, Min Kyu, et al. "Balancing DRAM locality and parallelism in shared memory CMP systems." IEEE International Symposium on High-Performance Comp Architecture. IEEE, 2012.

Kim, Dae-Hyun, Prashant J. Nair, and Moinuddin K. Qureshi. "Architectural support for mitigating row hammering in DRAM memories" IEEE Computer Architecture Letters 14.1 (2014): 9-12.

Kim, Yoongu, et al. "Flipping bits in memory without accessing them: An experimental study of DRAM disturbance errors " ACM SIGARCH Computer Architecture News 42.3 (2014): 361-372.

Liu, Jamie, et al. "RAIDR: Retention-aware intelligent DRAM refresh." ACM SIGARCH Computer Architecture News 40.3 (2012): 1-12.

Nair, Prashant J., Dae-Hyun Kim, and Moinuddin K. Qureshi. "ArchShield: Architectural framework for assisting DRAM scaling by tolerating high error rates" ACM SIGARCH Computer Architecture News 41.3 (2013): 72-83.

Seyedzadeh, Seyed Mohammad, Alex K. Jones, and Rami Melhem. "Mitigating wordline crosstalk using adaptive trees of counters." 2018 ACM/IEEE 45th Annual International Symposium on Computer Architecture (ISCA). IEEE, 2018.

Van De Goor, Ad J., and Ivo Schanstra. "Address and data scrambling: Causes and impact on memory tests." Proceedings First IEEE International Workshop on Electronic Design, Test and Applications' 2002. IEEE, 2002.

Zhou, Sheng-hua, Wancheng Zhang, and Nan-Jian Wu. "An ultra-low power CMOS random number generator." Solid-State Electronics 52.2 (2008): 233-238.

* cited by examiner

MEMORY ROW RECORDING FOR MITIGATING CROSSTALK IN DYNAMIC RANDOM ACCESS MEMORY

GOVERNMENT RIGHTS

This invention was made with Government support under PathForward Project with Lawrence Livermore National Security (Prime Contract No. DE-AC52-07NA27344, Subcontract No. B620717) awarded by DOE. The Government has certain rights in this invention.

CROSS-REFERENCE TO RELATED APPLICATIONS

This application is related to co-pending U.S. patent application Ser. No. 16/710,424 entitled "Method and Apparatus for Mitigating Row Hammer Attacks", filed on Dec. 11, 2019, which is incorporated by reference in its entirety.

BACKGROUND

Because of high memory intensive workloads and many-core systems, demand for high dynamic random access memory (DRAM) capacity is increasing more than ever. One way to increase DRAM capacity is to scale down memory technology via reducing the proximity and size of cells and packing more cells in the same die area.

Recent studies show that because of high process variation and strong parasitic capacitances among cells of physically adjacent wordlines, wordline electromagnetic coupling (crosstalk) considerably increases in technology nodes below the 22 nm process node. Frequently activating and closing wordlines exacerbates the crosstalk among cells leading to disturbance errors in adjacent wordlines, thereby endangering the reliability of future DRAM technology. In addition, wordline crosstalk provides attackers with a mechanism for intentionally inducing errors in the memory, such as main memory. The malicious exploit of crosstalk by repeatedly accessing a word line is known as "row hammering", where the row hammering threshold refers to the minimum number of wordline accesses performed before the first error occurs.

BRIEF DESCRIPTION OF THE DRAWINGS

The present disclosure is illustrated by way of example, and not by way of limitation, in the figures of the accompanying drawings.

DETAILED DESCRIPTION

The following description sets forth numerous specific details such as examples of specific systems, components, methods, and so forth, in order to provide a good understanding of the embodiments. It will be apparent to one skilled in the art, however, that at least some embodiments may be practiced without these specific details. In other instances, well-known components or methods are not described in detail or are presented in a simple block diagram format in order to avoid unnecessarily obscuring the embodiments. Thus, the specific details set forth are merely exemplary. Particular implementations may vary from these exemplary details and still be contemplated to be within the scope of the embodiments.

Due to the high process variation of DRAM cells in future technology nodes, a large number of word lines will be vulnerable to crosstalk. A small number of victim rows vulnerable to crosstalk can be stored in a single hash-based Bloom filter so that a row hammering countermeasure can be selectively enabled; however, when the number of victim rows increases due to the scaling down of DRAM cells, storing a large number of victim rows in a single hash-based Bloom filter incurs a high penalty with respect to area, power and performance overheads.

In one embodiment, a large number of vulnerable word lines are tracked for selective crosstalk protection by a mechanism that stores the vulnerable word lines addresses in a reserved area of the DRAM, then utilizes two temporally overlapped probabilistic filters (e.g., Bloom filters) to, in response to memory access requests, record potential victim word line addresses fetched from the reserved area. The temporal overlapping of the probabilistic filters is accomplished by a sequence controller, which selects one of the two probabilistic filters for determining whether rows adjacent to the requested memory address are potential victim word lines. The sequence controller also controls when each of the probabilistic filters is cleared to eliminate stale vulnerable word line addresses. The mechanism thus facilitates tracking of a large number of potential victim word lines so that a row hammering countermeasure can be selectively enabled. The effects of word line crosstalk and row hammering attacks against the main memory are mitigated with minimal impact to area, power consumption, and performance overheads.

Figure 1:
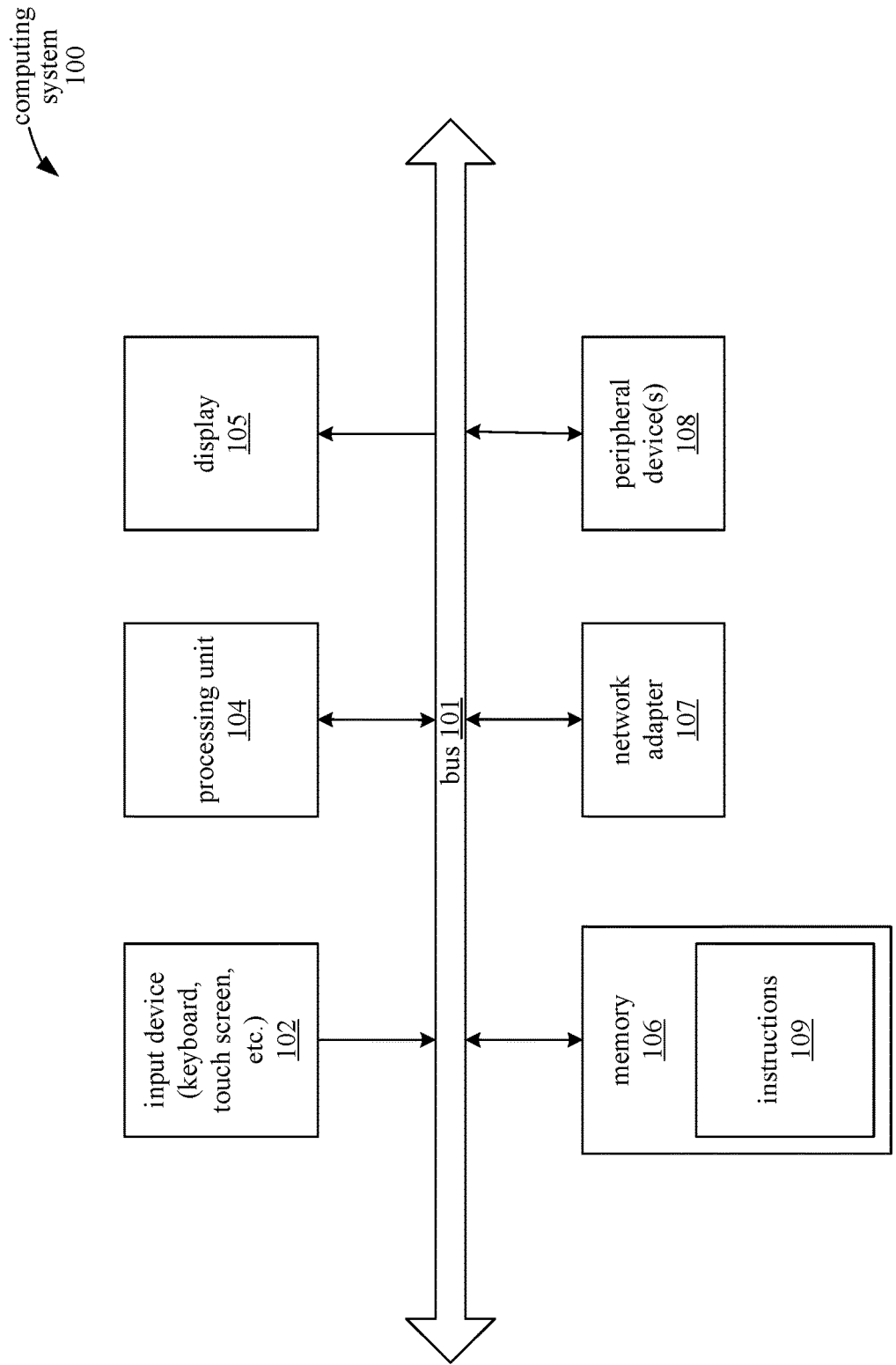
FIG. 1 illustrates a computing system, according to an embodiment.

FIG. 1 illustrates an embodiment of a computing system 100 in which the above crosstalk mitigation mechanism is implemented. In general, the computing system 100 is embodied as any of a number of different types of devices, including but not limited to a laptop or desktop computer, mobile device, server, network switch or router, etc. The computing system 100 includes a number of hardware resources, including components 102-108, which communicate with each other through a bus 101. In computing system 100, each of the components 102-108 is capable of communicating with any of the other components 102-108 either directly through the bus 101, or via one or more of the other components 102-108. The components 101-108 in computing system 100 are contained within a single physical enclosure, such as a laptop or desktop chassis, or a mobile phone casing. In alternative embodiments, some of the components of computing system 100 are embodied as external peripheral devices such that the entire computing system 100 does not reside within a single physical enclosure.

The computing system 100 also includes user interface devices for receiving information from or providing information to a user. Specifically, the computing system 100 includes an input device 102, such as a keyboard, mouse, touch-screen, or other device for receiving information from the user. The computing system 100 displays information to the user via a display 105, such as a monitor, light-emitting diode (LED) display, liquid crystal display, or other output device.

Computing system 100 additionally includes a network adapter 107 for transmitting and receiving data over a wired or wireless network. Computing system 100 also includes one or more peripheral devices 108. The peripheral devices 108 may include mass storage devices, location detection devices, sensors, input devices, or other types of devices used by the computing system 100. Memory system 106 includes memory devices used by the computing system 100, such as random-access memory (RAM) modules, read-only memory (ROM) modules, hard disks, and other non-transitory computer-readable media.

Computing system 100 includes a processing unit 104. In one embodiment, the processing unit 104 includes multiple processing cores that reside on a common integrated circuit substrate. The processing unit 104 receives and executes instructions 109 that are stored in a memory system 106. At least a portion of the instructions 109 defines an application including instructions that are executable by the processing unit 104.

Some embodiments of computing system 100 may include fewer or more components than the embodiment as illustrated in FIG. 1. For example, certain embodiments are implemented without any display 105 or input devices 102. Other embodiments have more than one of a particular component; for example, an embodiment of computing system 100 could have multiple processing units 104, buses 101, network adapters 107, memory systems 106, etc.

Figure 2A:
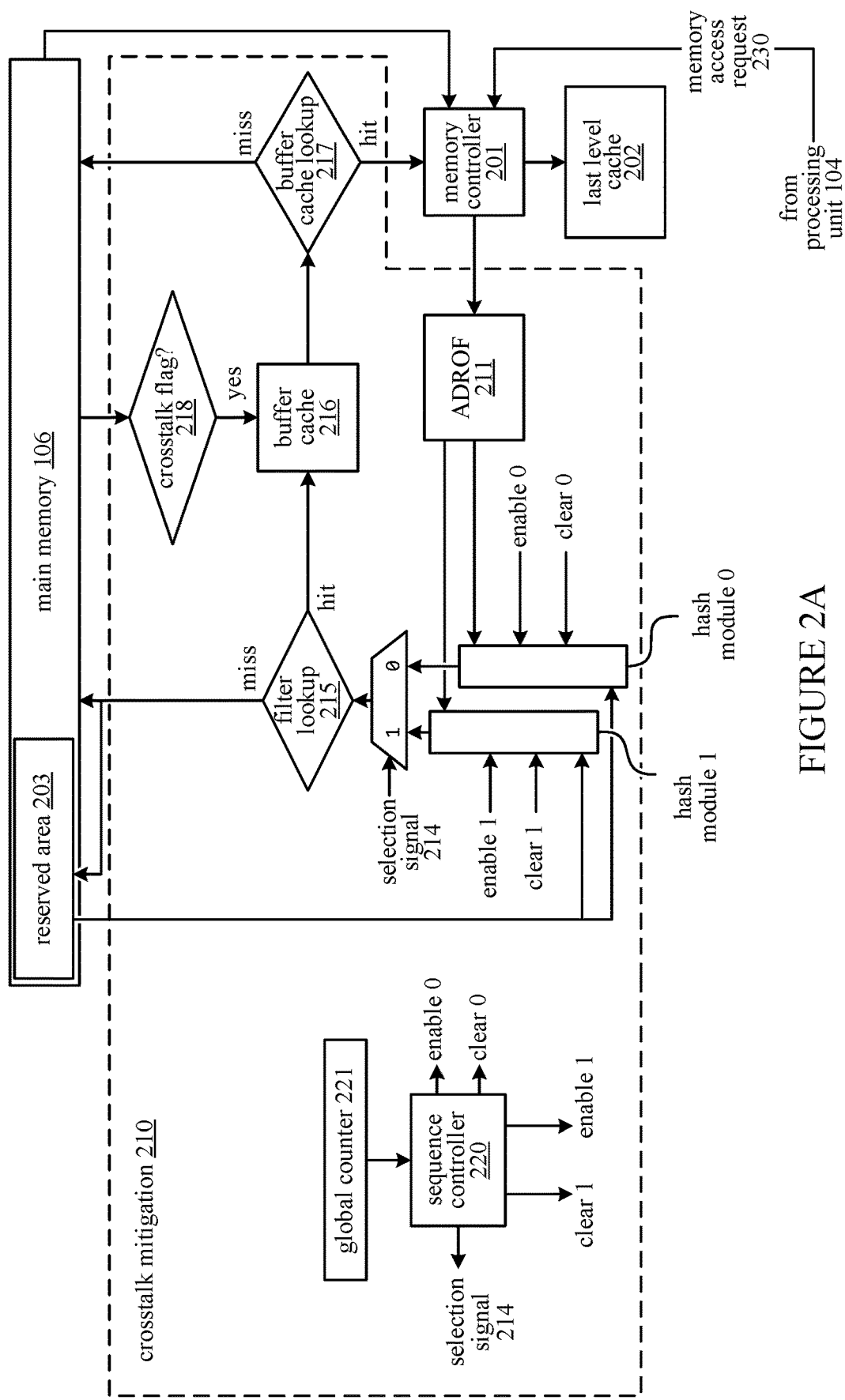
FIG. 2A illustrates a crosstalk mitigation circuit, according to an embodiment.

FIG. 2A illustrates crosstalk mitigation circuitry 210 that reduces the number of accesses to frequently accessed aggressor word lines that induce errors in the victim word lines that are vulnerable to crosstalk, according to an embodiment. In one embodiment, the crosstalk mitigation circuitry 210 is implemented in the same device package or integrated circuit as the main memory 106. In one embodiment, the crosstalk mitigation circuitry 210 resides in the same device package or integrated circuit as a memory controller 201 that interfaces with the main memory 106.

For a large number of victim rows in deeply scaled DRAM devices, victim row addresses are discovered as part of DRAM tests during a memory testing phase. The processing unit 104 performs DRAM testing by reading potential aggressor rows many times in order to detect changes in their adjacent victim rows. After a set of victim rows has been identified, the results are saved in a reserved area 203 of the main memory 106 so that it can be referenced at runtime without further testing. The row address for each of the victim rows in the discovered set is recorded in the reserved memory area 203.

At runtime, the crosstalk mitigation circuit 210 responds to a memory access request 230 by selectively enabling a crosstalk mitigation mechanism based on determining whether possible victim rows are susceptible to crosstalk when the requested memory address is repeatedly accessed. Upon receiving a memory access request 230 (e.g., a read request) generated by the processor 104 that is directed to the main memory 106, the memory controller 201 sends the address of the memory request 230 to the adjacent row finder (ADROF) module 211. The ADROF 211 receives the address and identifies upper and/or lower candidate victim rows that are adjacent to the row containing the requested memory address. The candidate victim rows are provided to hash module 0 and hash module 1.

The crosstalk mitigation circuit implements a set of probabilistic Bloom filters using, for each filter, a hash module that calculates multiple hash functions and includes a corresponding bit array for storing the filter data. The hash modules 0 and 1 are used when determining whether candidate victim addresses are in the set of actual victim addresses previously identified during the DRAM testing stage. When a lookup of a candidate victim address in a selected one of the probabilistic filters is performed, a hit result indicates that the candidate victim address is an actual victim address. For each candidate victim row, if the lookup of the candidate victim row results in a miss in the selected probabilistic filters, the reserved area 203 is checked to determine whether the candidate victim row is in the actual set of victim address.

In one embodiment, the row addresses of actual victim rows are hashed and stored in the reserved area 203. When a candidate victim row address is looked up in the reserved area 203, the hash functions return a deasserted 'update' signal to the crosstalk mitigation logic 210 if the candidate victim row is not an actual victim row. If the candidate victim row address is a victim row, the hash function asserts the 'update' signal sent to the crosstalk mitigation logic 210. The 'update' signal, when asserted, causes the row addresses to be added to the probabilistic filters.

If the candidate victim row address is a victim row, at least one of the probabilistic filters is updated to include the victim row. In one embodiment, the updating is performed in parallel with returning the requested data block to the last level cache 202. Over time, a subset of the candidate victim rows that are found in the reserved area 203 are added to the set of probabilistic filters. The crosstalk mitigation circuit 210 is thus able to quickly identify future candidate victim rows via lookups in the probabilistic filters. In one embodiment, the 'update' signals and corresponding memory addresses to be added to the probabilistic filters are queued and periodically transferred to the crosstalk mitigation circuit 210 for updating the hash modules 0 and 1 at times when the data traffic between the main memory 106 and the memory controller 201 are reduced.

In order to implement temporally overlapped probabilistic filters, the crosstalk mitigation circuit 210 includes a sequence controller 220 that controls when victim rows are added to the probabilistic filters, which probabilistic filter is used for performing lookups, and when the probabilistic filters are cleared. The sequence controller 220 receives a timing signal from a global counter 221, which records the number of memory accesses received by the memory controller 201. Accordingly, each time period indicated by the global counter 221 corresponds to a memory access. Each of the time periods begins when a corresponding memory access request in the stream of sequential memory access requests is received. The sequence controller 220 asserts the enable signal (enable 0) of the first hash module 0 at the first memory access, and asserts the enable signal (enable 1) of the second hash module 1 after a specific predetermined number of memory accesses. Victim rows are recorded via the hash modules 0 and 1 when the hash modules 0 and 1 are enabled by the enable 0 and enable 1 signals, respectively.

In addition, the sequence controller 220 periodically clears the contents of the probabilistic filters in alternate time periods via two clear signals, clear 1 and clear 0 to eliminate stale victim memory address locality. The clear 0 and clear 1 signals are asserted to reset the bit arrays in hash module 0 and hash module 1, respectively. Since the clearing is performed in alternate time periods, when the bit array of one filter is cleared, the addresses of recent victim rows is still available in the other filter.

The sequence controller 220 additionally generates a selection signal 214 based on the timing signal provided by the global counter 221. The selection signal 214 selects one of the hash modules 0 and 1 for performing lookups of candidate victim rows. When the selection signal 214 is asserted, the hash module 1 is selected. When the selection signal 214 is deasserted, the hash module 0 is selected. The selected hash module is used for performing the candidate victim row lookups. The selection signal 214 starts by selecting the first hash module 0, then toggles to select the hash module 0 and hash module 1 in alternating time periods. In particular, a hash module is selected when the other hash module is cleared.

Thus, in each time period indicated by the global counter 221, one of the hash modules 0 and 1 is selected or remains selected for determining whether one or more candidate victim rows associated with the most recent memory request 230 is an actual victim row. The crosstalk mitigation circuit 210 also includes control logic (e.g., 215, 217, and 218) for detecting victim rows and for implementing the row hammering countermeasure. Logic 215 checks the lookup result of a candidate victim row in the selected hash module, which uses a set of hash functions to generate corresponding hash results based on the address of the candidate victim row. Each of the hash results points to a bit in a bit array of the hash module. In order for a candidate victim row to be verified as an actual victim row, a majority of the hash results refers to a bit that is asserted in the bit array. If less than a majority of the referenced bits is asserted, then the candidate victim row misses.

If the candidate row misses in the hash module, the requested data is accessed in the main memory 106, and the data is returned via the memory controller 201 to the last level cache 202. In parallel, the main memory 106 returns a true/false signal to the hash modules (e.g., directly or via the memory controller 201) that indicates whether the corresponding candidate victim row is an actual victim row having an address or other identifier that is recorded in the reserved area.

If the candidate victim row is an actual victim row, it is added to each of the enabled probabilistic filters. In each of the corresponding enabled hash modules, all of the bits referenced by the hash results for the candidate victim row are asserted in the associated bit array. If the non-selected hash module is enabled, then the non-selected hash module similarly calculates the hash results for the candidate victim row in the non-selected hash module and asserts the referenced bits in its associated bit array. Latency is not negatively impacted since updating the hash modules is performed in parallel with returning the data to the last level cache 202.

If the logic 215 detects a hit result from one of the candidate victim rows (from the selected probabilistic filter or from the reserved area), the memory row being accessed is treated as an aggressor row. A crosstalk flag is set to enable a row hammering countermeasure, which is implemented using a buffer cache 216. The buffer cache 216 stores data from potential aggressor rows so that the data is available without repeatedly accessing the aggressor row in the main memory 106. Accordingly, the buffer cache 216 is checked by buffer cache lookup logic 217 to determine whether the buffer cache 216 contains the data for the aggressor row being accessed. If the buffer cache 216 already contains the requested data, the lookup 217 results in a hit and the cached line containing the data is sent to the memory controller 201 without accessing the main memory 106, which reduces the memory access time. If the requested data is not in the buffer cache 216, then the lookup 217 results in a miss and the row containing the data is read from the main memory 106. Logic 218 detects that the crosstalk flag is set (indicating that the row hammering countermeasure is enabled) and responds by fetching the requested data from the main memory 106 to the buffer cache 216. The memory access request 230 is serviced by reading the data from the buffer cache 216. Since the aggressor row is now in the buffer cache 216, subsequent read requests directed to the same aggressor row are serviced from the buffer cache 216 without accessing the main memory 106, thus preventing row hammering of the adjacent victim rows.

Figure 2B:
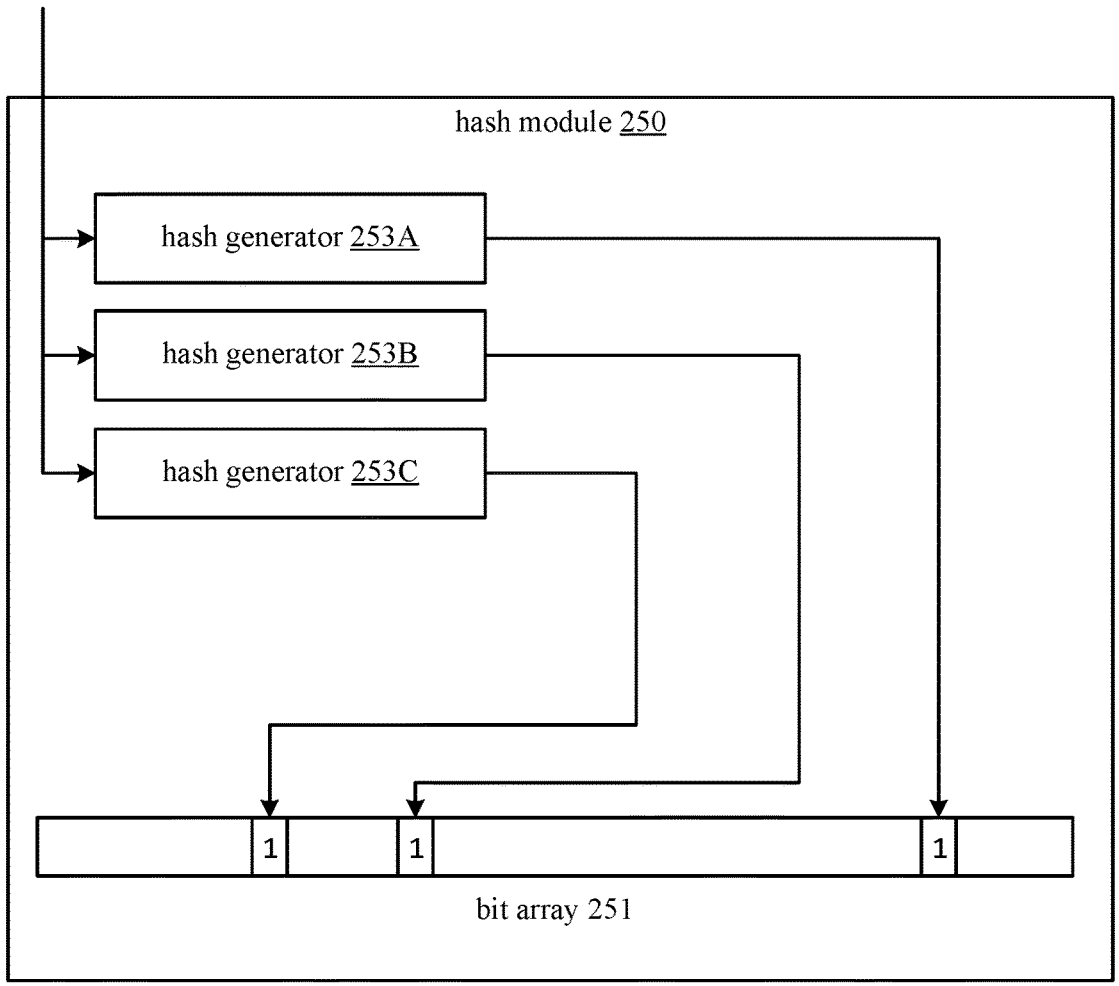
FIG. 2B illustrates a hash module, according to an embodiment.

FIG. 2B illustrates an embodiment of a hash module 250, which represents either of the hash modules 0 and 1 that are used to implement the probabilistic Bloom filters in the crosstalk mitigation circuit 210. The hash module 250 includes three hash generators 253A, 253B, and 253C and a bit array 251. Each of the hash generators 253A-C receives the candidate victim row address 252 and calculates a hash result using a different hash function. For each candidate victim row address that is added to the probabilistic filter, the hash module sets three bits in the bit array 251. If a lookup is subsequently performed for the same candidate victim address 252, the hash results calculated by hash generators 253A-C refer to the same bits that were previously set, and the candidate victim row address 252 is determined to be the address of an actual victim row. If the candidate victim row address 252 misses, the address 252 is looked up in the reserved area 203.

In one embodiment, the probabilistic filter is a hash-based bloom filter that operates based on majority voting. If two out of three reference bits are set, the lookup of the candidate victim row address 252 results in a hit. However, if zero or one out of the three referenced bits is set, the candidate victim row address misses. In general, given an odd number of hash generators M, the lookup results in a hit if more than M/2 of the referenced bits are set. For example, a hit results if M=7 and at least 4 reference bits are set.

In one embodiment, each hash module is modeled as a 1.25 KB direct-mapped cache with a 64-bit line size. In this configuration, the upper and lower rows of the candidate victim row address are provided sequentially to the hash module. Alternatively, sequential access latency can be avoided by using hash modules in parallel for checking whether the upper and lower portions of the row are victims or not at the expense of extra area overhead. In one embodiment, the contents of the hash module are stored in volatile memory; alternatively, the contents can be stored in non-volatile memory.

Figure 3:
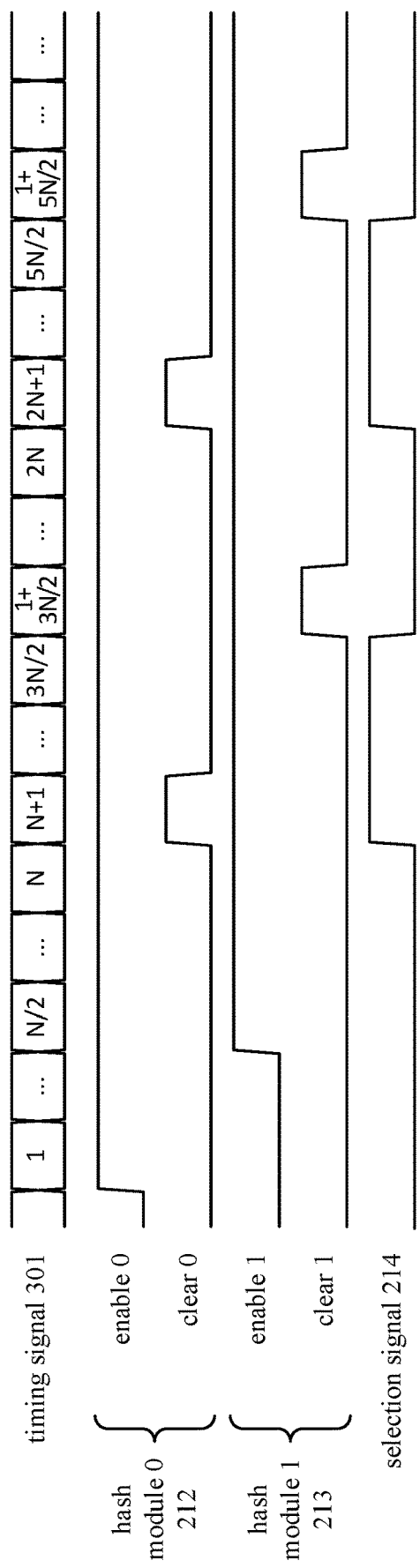
FIG. 3 is a timeline illustrating operation of a sequence controller, according to an embodiment.

FIG. 3 illustrates a timeline showing the operation of the sequence controller 220, according to an embodiment. The global counter 221 counts the number of memory accesses requests (including the memory access request 230) received by the memory controller 201 and generates a timing signal 301 for the sequence controller 220. The timing signal 301 thus defines a series of time periods each corresponding to one of the received memory access requests.

Hash module 0 and hash module 1 are enabled by asserting the respective enable 0 and enable 1 signals high. Thus, the hash module 0 is enabled and starts recording the identified actual victim row addresses in the first time period 1. Hash module 1 is enabled at a later time N/2 so that it has capacity to add more victim row addresses for another N/2 time periods when hash module 0 is cleared at time N+1.

The selected hash module is cleared and the other hash module is selected every N time periods. Accordingly, the victim addresses in the first probabilistic filter are cleared in each of a first set of time periods (e.g., the N+1 and 2N+1 periods) and the victim addresses in the second probabilistic filter are cleared in each of a second set of time periods (e.g., the 1+3N/2 and 1+5N/2 periods) that are interleaved alternately with the first set of time periods. The first probabilistic filter is cleared by resetting all of the bits in the bit array 251 of the hash module 0 of the first probabilistic filter. Similarly, the second probabilistic filter is cleared by resetting all of the bits in the bit array of the hash module 1 of the second probabilistic filter.

In the same time period in which each probabilistic filter is cleared, the other probabilistic filter is selected for performing lookups of candidate victim row addresses. As shown in FIG. 3, the selection signal 214 toggles at each of the first set of time periods (e.g., N+1 and 2N+1) and each of the second set of time periods (e.g., 1+3N/2 and 1+5N/2). When the selection signal 214 is low, the hash module 0 is selected. When the selection signal 214 is high, the hash module 1 is selected.

For example, when the hash module 0 of the first probabilistic filter is cleared at time period 2N+1, the hash module 1 of the second probabilistic filter has already been recording victim addresses for the most recent N/2 time periods. Thus, the most recently identified victim addresses are still available in the second probabilistic filter when the second probabilistic filter is selected in the same time period 2N+1.

In one embodiment, the value of N is selected based on the row hammering threshold and the number of memory accesses per DRAM refresh interval of the main memory 106. A sufficiently high value is selected such that the number of overlapped memory accesses N/2 between the two hash modules 0 and 1 is also high enough to guarantee that the number of accesses to a physical aggressor row does not reach the row hammering threshold within each refresh interval.

Figure 4A:
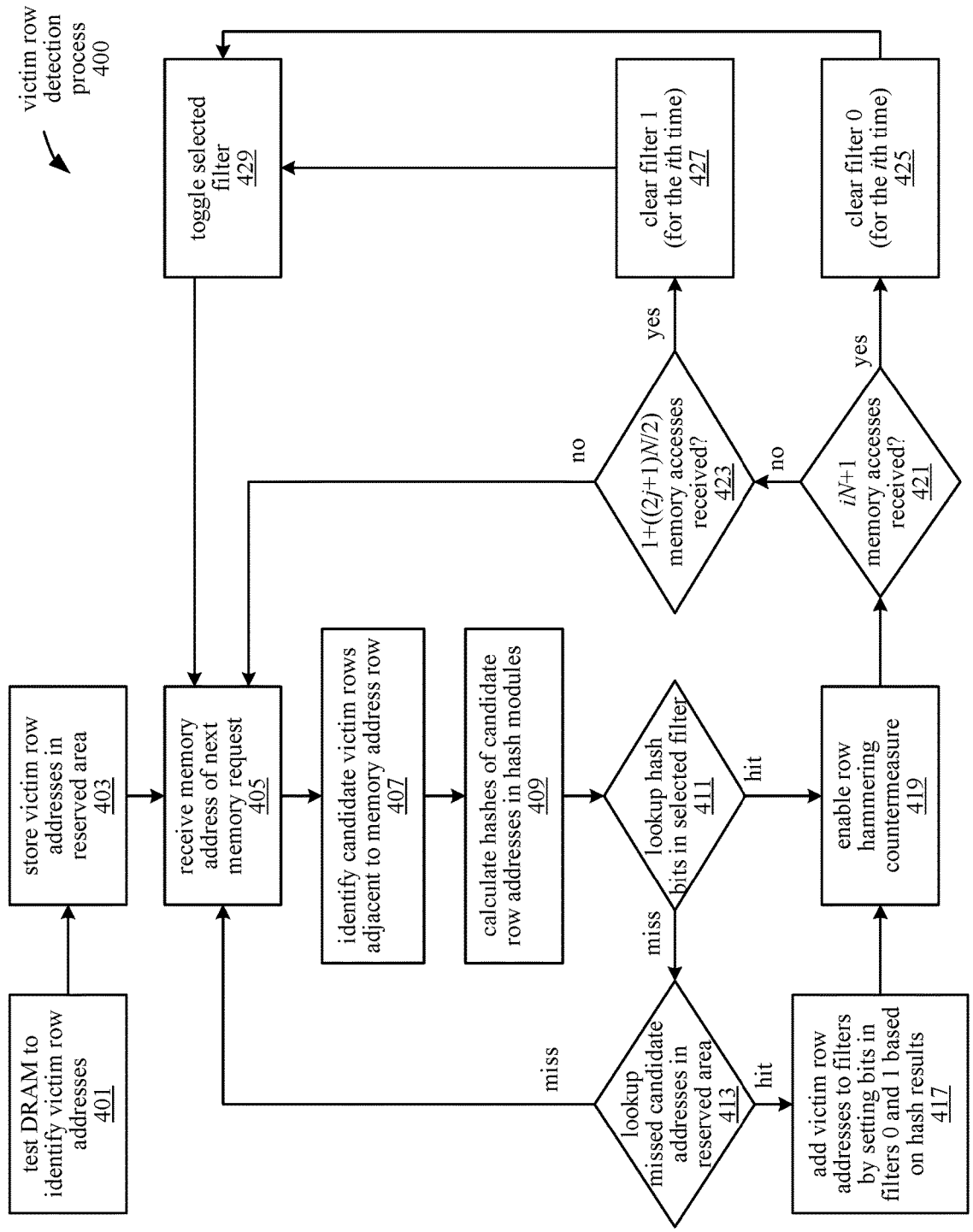
FIG. 4A is a flow diagram illustrating a victim row detection process, according to an embodiment.

FIG. 4A illustrates an embodiment of a victim row detection process 400. The victim row detection process 400 is performed by components of the computing system 100, such as the crosstalk mitigation circuitry 210, memory controller 201, and main memory 106.

At block 401, the crosstalk mitigation circuit 210 identifies actual victim rows in the main memory 106 by testing the memory device 106. The testing process includes repeatedly writing bit patterns to potential aggressor rows and reading adjacent rows to determine whether the adjacent rows were affected by crosstalk. Rows that are affected by crosstalk are identified as actual victim rows. At block 403, the identified victim rows are recorded in the reserved area 203 of the main memory 106. An address of each victim row is stored in the reserved area 203 or alternatively, a hash of the address is stored.

At block 405, the memory controller 201 receives a memory access request 230 that is directed to a memory address in the main memory 106. The address of the request 230 is sent to the ADROF 211, which identifies candidate victim rows for the address at block 407. The candidate rows are the upper and lower adjacent rows of the memory row containing the requested address.

At block 409, the identified candidate victim rows are transmitted to the hash modules 0 and 1. Each of the hash modules 0 and 1 calculates a set of hash result bits (i.e., as references to bit positions in the bit array of the hash module) for each candidate victim address by applying a set of hash functions to the candidate victim address. Each bit position in the set of hash result bits is calculated by a hash generator (e.g., 253A-C) that applies one of the set of hash functions to the candidate victim address. At block 411, each of the hash result bits is looked up in the bit array of the selected hash module. A hit results when a majority of the hash result bits is set; accordingly, the candidate victim address is determined to be an actual victim address. In the case of a hit result at block 411, the process 400 continues at block 419. If a majority of the referenced hash result bits is not asserted in the bit array, a miss occurs and the process 400 continues at block 413.

At block 413, the reserved area 203 is checked to determine whether it contains the candidate victim addresses that were not found in the selected probabilistic filter. If the reserved area 203 does not contain any of the candidate victim addresses, then the candidate victim addresses are not actual victim addresses. In this case, the process 400 returns from block 413 to block 405 to continue detecting victim rows for the next memory request. Row hammering countermeasures are not enabled for the current memory request 230 since the requested address is not in an aggressor row, and the rows adjacent to the requested address are not victim rows.

At block 413, if either of the candidate victim rows is found in the reserved area 203, the candidate victim rows that are found are confirmed to be actual victim rows. The process 400 continues at block 417, in which the confirmed victim rows are added to the probabilistic filters that are enabled. Each confirmed victim row address is added to a probabilistic filter by, in the hash module for the filter, calculating a set of hash result bits using the victim row address as an input to the hash generators. The resulting bits are recorded by asserting the bits in the bit array of the hash module as previously described with reference to FIG. 2B.

A candidate victim address is thus determined to be an actual victim address when a lookup 411 of the candidate victim address returns a hit in either the selected probabilistic filter, or when a lookup 413 of the candidate victim address returns a hit in the reserved area 203. Accordingly, the process 400 continues at block 419 from either block 411 or block 417, respectively. At block 419, a row hammering countermeasure is enabled to prevent the victim rows from being affected by the requested memory access. The row hammering countermeasure is enabled by asserting a crosstalk flag.

Blocks 421 and 423 are performed by the sequence controller 220 by detecting whether the current time period as indicated by the global counter 221 is one in which the first or second probabilistic filter, respectively, is scheduled to be cleared. If none of the probabilistic filters is scheduled to be cleared in the current time period, the process 400 proceeds from block 421 to block 423, and then returns to block 405 to continue detecting victim rows for the next memory request without clearing any filters.

The first probabilistic filter 0 is cleared when iN+1 memory accesses have been received, where i is an integer value greater than zero. Thus, at block 421, if iN+1 memory accesses have been received, the first filter 0 is cleared at block 425 for the ith time. For example, the second time the first filter 0 is cleared is in the time period when 2N+1 memory accesses have been received. The probabilistic filter 0 is cleared by asserting the clear 0 signal to reset all of the bits in the bit array 251 of its associated hash module 0.

The second probabilistic filter 1 is cleared when 1+((2j+1)N/2) memory accesses have been received, where j is an integer value greater than zero. Thus, at block 423, 1+((2j+1)N/2) memory accesses have been received, the second filter 1 is cleared at block 427 for the jth time. For example, the second time the second filter 1 is cleared is in the time period when 1+(5N/2) memory accesses have been received.

The probabilistic filter 1 is cleared by asserting the clear 1 signal to reset all of the bits in the bit array of its associated hash module 1.

The process 400 arrives at block 429 from block 427 or block 425. At block 429, the probabilistic filter selected for performing lookups of incoming candidate victim rows is toggled. That is, the filter that is not selected in the previous time period is selected, and the filter that is selected in the previous time period is deselected. After clearing of one filter (as provided at blocks 425 and 427), the other filter is selected for performing lookups. Accordingly, in each of the iN+1 time periods, the probabilistic filter 1 is selected for performing lookups of candidate victim rows. In each of the 1+((2i+1)N/2) time periods, the probabilistic filter 0 is selected for performing lookups of the candidate victim rows. Thus, at the time it is selected, the selected filter already includes the victim addresses that were encountered during the prior N/2 time periods. From block 429, the process 400 returns to block 405. Blocks 405-429 are thus repeated to continue detecting victim rows for subsequent memory accesses.

Figure 4B:
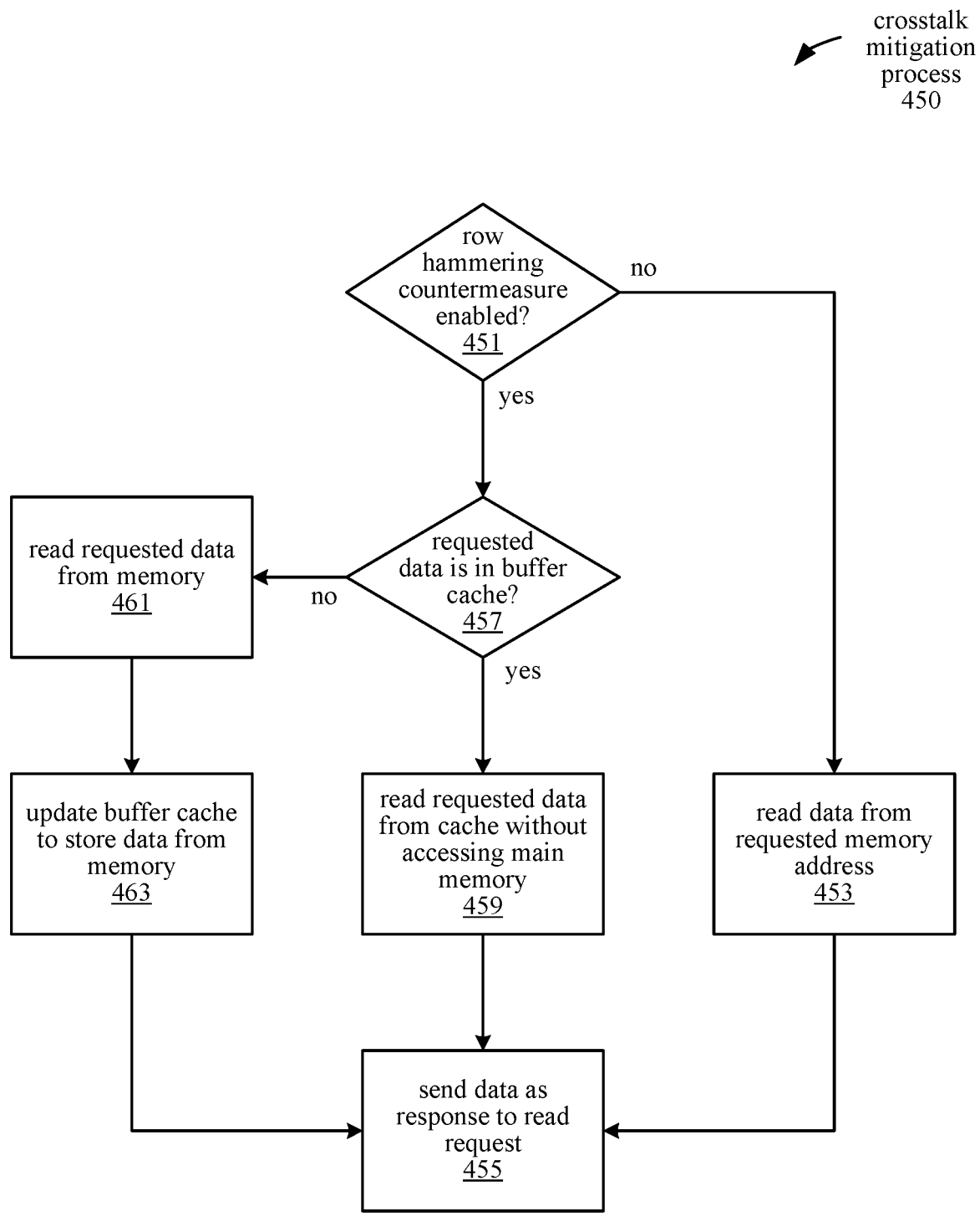
FIG. 4B is a flow diagram illustrating a crosstalk mitigation process, according to an embodiment.

FIG. 4B illustrates an embodiment of a crosstalk mitigation process 450 that is performed when servicing memory read requests. The crosstalk mitigation process 450 is performed for servicing each memory read request received by the memory controller 201, and performs a row hammering countermeasure when the row hammering countermeasure is enabled. The row hammering countermeasure is enabled at block 419 of process 400.

At block 451, the logic 218 in the crosstalk mitigation circuitry 210 checks a crosstalk flag to determine whether the row hammering countermeasure is enabled. If the crosstalk flag is not asserted, the row hammering countermeasure is not enabled, and the process 450 continues at block 453. At block 453, data is read from the requested memory address and is sent as a response to the memory request 230 at block 455.

At block 451, if the crosstalk flag is asserted, the process 450 continues at block 457. At block 457, the buffer cache 216 is checked to determine whether it contains the requested data. If so, the requested data is read from the buffer cache 216 without accessing the main memory, as provided at block 459. The data retrieved from the buffer cache 216 is sent as a response to the read request at block 455.

At block 461, if the requested data is not in the buffer cache 216, then the requested data is fetched from the requested address in the main memory 106 at block 461, and stored in the buffer cache 216 at block 463. Since the data is now available from the buffer cache 216, data for subsequent read requests to the same aggressor memory row can be retrieved from the buffer cache 216 without repeatedly accessing the aggressor word line in the main memory 106. At block 455, the requested data retrieved from the main memory is sent as a response to the read request 230.

In cooperation with the victim row detection process 400, the process 450 selectively uses the buffer cache to prevent row hammering when victim rows are detected, while accessing the memory 106 normally when vulnerable victim rows are not detected. The use of temporally overlapping probabilistic filters allows a large number of victim row addresses to be tracked and identified.

As used herein, the term "coupled to" may mean coupled directly or indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a non-transitory computer-readable medium. These instructions may be used to program a general-purpose or special-purpose processor to perform the described operations. A computer-readable medium includes any mechanism for storing or transmitting information in a form (e.g., software, processing application) readable by a machine (e.g., a computer). The non-transitory computer-readable storage medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory, or another type of medium suitable for storing electronic instructions.

Additionally, some embodiments may be practiced in distributed computing environments where the computer-readable medium is stored on and/or executed by more than one computer system. In addition, the information transferred between computer systems may either be pulled or pushed across the transmission medium connecting the computer systems.

Generally, a data structure representing the computing system 100 and/or portions thereof carried on the computer-readable storage medium may be a database or other data structure which can be read by a program and used, directly or indirectly, to fabricate the hardware including the computing system 100. For example, the data structure may be a behavioral-level description or register-transfer level (RTL) description of the hardware functionality in a high level design language (HDL) such as Verilog or VHDL. The description may be read by a synthesis tool which may synthesize the description to produce a netlist including a list of gates from a synthesis library. The netlist includes a set of gates which also represent the functionality of the hardware including the computing system 100. The netlist may then be placed and routed to produce a data set describing geometric shapes to be applied to masks. The masks may then be used in various semiconductor fabrication steps to produce a semiconductor circuit or circuits corresponding to the computing system 100. Alternatively, the database on the computer-readable storage medium may be the netlist (with or without the synthesis library) or the data set, as desired, or Graphic Data System (GDS) II data.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be in an intermittent and/or alternating manner.

In the foregoing specification, the embodiments have been described with reference to specific exemplary embodiments thereof. It will, however, be evident that various modifications and changes may be made thereto without departing from the broader scope of the embodiments as set forth in the appended claims. The specification and drawings are, accordingly, to be regarded in an illustrative sense rather than a restrictive sense.

What is claimed is:

1. A method, comprising:
adding a set of one or more victim rows to a first probabilistic filter and to a second probabilistic filter;
in response to a memory access request, identifying a candidate victim row adjacent to a memory address specified by a memory access request;
identifying the candidate victim row as a victim row in the set of victim rows based on performing a lookup of the candidate victim row in a selected filter, wherein the selected filter comprises one of the first probabilistic filter and the second probabilistic filter;
in response to identifying the candidate row as the victim row, enabling a row hammering countermeasure;
clearing the first probabilistic filter in each of a first set of time periods; and
clearing the second probabilistic filter in each of a second set of time periods interleaved with the first set of time periods.

2. The method of claim 1, wherein:
each time period in the first set of time periods and the second set of time periods begins when a corresponding one of a plurality of sequential memory access requests is received; and
the plurality of sequential memory access requests includes the memory access request.

3. The method of claim 1, further comprising:
in each of the first set of time periods, selecting the second probabilistic filter as the selected filter; and
in each of the second set of time periods, selecting the first probabilistic filter as the selected filter.

4. The method of claim 1, wherein adding the set of victim rows to the first probabilistic filter comprises:
calculating a first set of hash result bits based on a victim row address for each of the set of victim rows, and
recording the first plurality of hash result bits in a first bit array; and
adding the set of victim rows to the second probabilistic filter comprises:
calculating a second set of hash result bits based on the victim row address for each of the set of victim rows, and
recording the second plurality of hash result bits in a second bit array.

5. The method of claim 4, wherein:
calculating the first set of hash result bits comprises, for each hash function in a first set of hash functions of the first probabilistic filter, calculating one of the first set of hash result bits by applying the hash function to the victim row address;
clearing the first probabilistic filter comprises resetting all of the bits in the first bit array;
calculating the second set of hash result bits comprises, for each hash function in a second set of hash functions of the second probabilistic filter, calculating one of the second set of hash result bits by applying the hash function to the victim row address; and
clearing the second probabilistic filter comprises resetting all of the bits in the second bit array.

6. The method of claim 1, further comprising:
prior to adding the set of victim rows to the first probabilistic filter and to the second probabilistic filter, identifying the set of victim rows by testing a memory device; and
in a reserved memory area of the memory device, recording a victim row address for each of the set of victim rows, wherein the memory access request is directed to the memory device.

7. The method of claim 6, wherein:
each victim row of the set of victim rows is added to the first probabilistic filter and to the second probabilistic filter in response to determining that the victim row address of the victim row is recorded in the reserved memory area.

8. The method of claim 1, further comprising, in response to the enabling of the row hammering countermeasure, performing the row hammering countermeasure by:
if a buffer cache does not contain data requested by the memory access request, fetching the requested data from a memory device to the buffer cache; and
servicing the memory access request by reading the data from the buffer cache.

9. The method of claim 1, wherein:
for each victim row in the set of victim rows, the victim row is added to the first probabilistic filter and to the second probabilistic filter in parallel with fetching data from the memory device to a last level cache.

10. A computing device, comprising:
a set of probabilistic filters comprising a first probabilistic filter and a second probabilistic filter and configured to record a set of one or more victim rows;
a sequence controller coupled with the set of probabilistic filters, wherein the sequence controller is configured to:
clear the first probabilistic filter in each of a first set of time periods, and
clear the second probabilistic filter in each of a second set of time periods interleaved with the first set of time periods;
an adjacent row finder module coupled with the first probabilistic filter and the second probabilistic filter and configured to, in response to a memory access request, identify a candidate victim row adjacent to a memory address specified by the memory access request; and
control logic configured to:
identify the candidate victim row as a victim row in the set of victim rows based on performing a lookup of the candidate victim row in a selected filter, wherein the selected filter comprises one of the first probabilistic filter and the second probabilistic filter, and
in response to identifying the candidate row as the victim row, enable a row hammering countermeasure.

11. The computing device of claim 10, wherein the sequence controller is further configured to:
in each of the first set of time periods, select the second probabilistic filter as the selected filter; and
in each of the second set of time periods, select the first probabilistic filter as the selected filter.

12. The computing device of claim 10, further comprising:
a first set of hash generators coupled with the sequence controller and configured to
calculate a first set of hash result bits based on a victim row address for each of the set of victim rows, and
record the first set of hash result bits in a first bit array associated with the first probabilistic filter; and
a second set of hash generators coupled with the sequence controller and configured to calculate a second set of hash result bits based on a victim row address for each of the set of victim rows, and record the second set of hash result bits in a second bit array associated with the second probabilistic filter.

13. The computing device of claim 12, wherein the sequence controller is further configured to:
    clear the first probabilistic filter by resetting all of the bits in the first bit array; and
    clear the second probabilistic filter by resetting all of the bits in the second bit array.

14. The computing device of claim 10, further comprising a processor coupled with the control logic and configured to:
    prior to adding the set of victim rows to the first probabilistic filter and to the second probabilistic filter, identify the set of victim rows by testing a memory device; and
    in a reserved memory area of the memory device, record a victim row address for each of the set of victim rows, wherein the memory access request is directed to the memory device.

15. The computing device of claim 14, wherein the set of probabilistic filters is further configured to:
    record each victim row of the set of victim rows in the first probabilistic filter and in the second probabilistic filter in response to determining that the victim row address of the victim row is recorded in the reserved memory area.

16. The computing device of claim 10, further comprising:
    a buffer cache coupled with the control logic, wherein the control logic is further configured to, in response to the enabling of the row hammering countermeasure:
    if the buffer cache does not contain data requested by the memory access request, fetch the requested data from a memory device to the buffer cache, and
    service the memory access request by reading the data from the buffer cache.

17. A computing system, comprising:
    a processor;
    a memory device coupled with the processor;
    a crosstalk mitigation circuit coupled with the memory device and configured to:
    add a set of one or more victim rows to a first probabilistic filter and to a second probabilistic filter,
    clear the first probabilistic filter in each of a first set of time periods, and
    clear the second probabilistic filter in each of a second set of time periods interleaved with the first set of time periods;
    in response to receiving a memory access request generated by the processor and directed to the memory device, identify a candidate victim row adjacent to a memory address specified by the memory access request;
    identify the candidate victim row as a victim row in the set of victim rows based on performing a lookup of the candidate victim row in a selected filter,
    wherein the selected filter comprises one of the first probabilistic filter and the second probabilistic filter, and
    in response to identifying the candidate row as the victim row, enable a row hammering countermeasure.

18. The computing system of claim 17, wherein the crosstalk mitigation circuit further comprises:
    a first hash module configured to:
    calculate a first set of hash result bits based on a victim row address for each of the set of victim rows, and
    record the first set of hash result bits in a first bit array associated with the first probabilistic filter; and
    a second hash module configured to:
    calculate a second set of hash result bits based on a victim row address for each of the set of victim rows, and
    record the second set of hash result bits in a second bit array associated with the second probabilistic filter,
    wherein the crosstalk mitigation circuit is further configured to:
    clear the first probabilistic filter by resetting all of the bits in the first bit array, and
    clear the second probabilistic filter by resetting all of the bits in the second bit array.

19. The computing system of claim 17, wherein the processor is further configured to:
    prior to the adding of the set of victim rows to the first probabilistic filter and to the second probabilistic filter, identify the set of victim rows by testing the memory device; and
    in a reserved memory area of the memory device, record a victim row address for each of the set of victim rows,
    wherein the crosstalk mitigation circuit is further configured to add each victim row of the set of victim rows to the first probabilistic filter and to the second probabilistic filter in response to determining that the victim row address of the victim row is recorded in the reserved memory area.

20. The computing system of claim 17, further comprising:
    a buffer cache coupled with the memory device, wherein the crosstalk mitigation circuit is further configured to, in response to the enabling of the row hammering countermeasure:
    if the buffer cache does not contain data requested by the memory access request, fetch the requested data from a memory device to the buffer cache, and
    service the memory access request by reading the data from the buffer cache.

* * * * *